United States Patent
Yang

(10) Patent No.: US 6,856,149 B2
(45) Date of Patent: Feb. 15, 2005

(54) CURRENT DETECTING CIRCUIT AC/DC FLYBACK SWITCHING POWER SUPPLY

(75) Inventor: Hui Chiang Yang, Taipei (TW)

(73) Assignee: Niko Semiconductor Co., Ltd., Taipei (TW)

(*) Notice: Subject to any disclaimer, the term of this patent is extended or adjusted under 35 U.S.C. 154(b) by 0 days.

(21) Appl. No.: 10/464,557

(22) Filed: Jun. 19, 2003

(65) Prior Publication Data

US 2004/0257095 A1 Dec. 23, 2004

(51) Int. Cl.[7] .............................................. G01R 29/20
(52) U.S. Cl. ..................................... 324/726; 362/21.14
(58) Field of Search .......................... 323/282; 324/714, 324/726; 363/15, 19, 21.04, 89, 97, 127, 21.14

(56) References Cited

U.S. PATENT DOCUMENTS 6,373,726 B1 * 4/2002 Russell ..................... 363/21.14
6,424,544 B1 * 7/2002 Svardsjo ................... 363/21.12
6,462,965 B1 * 10/2002 Uesono ..................... 363/21.14

* cited by examiner

*Primary Examiner*—N. Le
*Assistant Examiner*—Walter Benson
(74) *Attorney, Agent, or Firm*—Browdy and Neimark, P.L.L.C.

(57) ABSTRACT

A current detecting circuit connects to a secondary side of a transformer, including a first, second transistors and a field-effect transistor (FET). The first transistor has a base connecting with the base and collector of the second transistor to form a common base terminal, an emitter forming a first detecting terminal and an emitter forming a feedback terminal. The second transistor has a collector forming a second detecting terminal. The FET is used to replace a prior current rectifying diode. The FET has a source connecting to an output terminal of the transformer and a drain connecting to a direct current (DC) output terminal. The first, second detecting terminals and feedback terminal are connected with the source, drain and gate of the FET, respectively. Via detecting the current of the DC output terminal, the FET is timely turned on and off to release the energy stored in the transformer.

8 Claims, 3 Drawing Sheets

CURRENT DETECTING CIRCUIT AC/DC FLYBACK SWITCHING POWER SUPPLY

FIELD OF THE INVENTION

The present invention is directed to a current detecting circuit for AC/DC flyback switching power supply, and more particularly, to a current detecting circuit disposed on the secondary side of the alternating current/direct current (AC/DC) flyback switching power supply that uses bipolar transistors to detect the current alternation of a transformer and drives a field-effect transistor (FET) to release the stored energy of the transformer timely.

BACKGROUND OF THE INVENTION

In accordance with prior art, a DC power supply, e.g. AC/DC switching power supply, usually employs a high frequency pulse width modulation (PWM) control circuit to control the output voltage for reducing the entire volume. As shown in FIG. 1, which is a schematic diagram of a conventional AC/DC flyback switching power supply. The transformer T1 of the conventional AC/DC flyback switching power supply has two sides that are designated as primary side 101 and secondary side 102, respectively. The electrical signals of the primary side 101 and secondary side 102 are parted by a photodiode 111 and a light emitting diode (LED) 112. But, the variation of the voltage or current of the secondary side 102 can be fed back to the primary side 101 by an optical signal to synchronously adjust the voltage and current of the primary side 101 and secondary side 102. The optical signal can also be used as an over-current or short-circuit protection feedback signal.

The conventional AC/DC flyback switching power supply is a circuit, which is mainly used to transform an alternating voltage to a direct output voltage. Please refer to FIG. 2, which shows output waveforms of several components. The operation principle of the conventional AC/DC flyback switching power supply is as following: while the FET Q1 of the primary side 101 is turned on, since the diode D1 will be biased by a reverse voltage, the electrical energy will be stored in the transformer T1; while the FET Q1 is turned off, the diode D1 will be biased by a forward voltage and the stored energy will be released from the transformer T1. However, when the diode D1 is biased forwardly, the diode D1 will cause a voltage drop ranging from 0.4 V to 1.5 V, depending on the value of the output load. The value of the voltage drop multiplied by the value of the output current is the value of the power loss. If the output current is huge, the efficiency of the conventional AC/DC flyback switching power supply will drop substantially.

Accordingly, as discussed above, the conventional AC/DC flyback switching power supply still has some drawbacks that could be improved. The present invention aims to resolve the drawbacks in the prior art.

SUMMARY OF THE INVENTION

A main objective of the present invention is to provide a current detecting circuit that can reduce the power loss of the AC/DC flyback switching power supply tremendously.

For reaching the objective above, the present invention provides a current detecting circuit for AC/DC flyback switching power supply. The current detecting circuit is disposed on the secondary side of the transformer for detecting the current alternation of the transformer and timely turning off the FET of the secondary side to prevent the current from flowing backward to the transformer.

The current detecting circuit includes a first transistor and second transistor, i.e. bipolar junction transistors. The first transistor has a base connecting with the base collector of the second transistor to form a common base terminal. The first-transistor has an emitter forming a first detecting terminal and has a collector forming a feedback terminal. The second transistor has an emitter forming a second detecting terminal. The current detecting circuit further includes a field-effect transistor (FET). The FET has a source, a gate and a drain. The source connects to the first output terminal of the transformer. The drain connects to the DC output terminal. Therein, the first detecting terminal is connected with the source of the FET, the second detecting terminal is connected with the drain of the FET and the feedback terminal is connected with the gate of the FET. The FET is turned on by using an auxiliary voltage provided by the transformer via a buffer circuit. Further, by using the bipolar junction transistors to detect the current flowing through the FET, the FET can be turned off while the current approaches zero. Hence, the FET can replace the diode D1 of the conventional AC/DC flyback switching power supply and increase the efficiency.

Furthermore, the current detecting circuit complied with the present invention further comprises a buffer circuit including: a diode having a positive electrode connecting with the second output terminal of the transformer and having a negative electrode connecting with an auxiliary power terminal; a third transistor having a collector connecting with the auxiliary power terminal; a fourth transistor having an emitter connecting with the emitter of the third transistor and the gate of the FET, a base connecting with the base of the third transistor and the feedback terminal and a collector connecting with the first detecting terminal; and a second resistor connecting the feedback terminal with the auxiliary power terminal. The buffer circuit is used to assist the bipolar junction transistors in turning on the FET.

Numerous additional features, benefits and details of the present invention are described in the detailed description, which follows.

DETAILED DESCRIPTION

Figure 3:
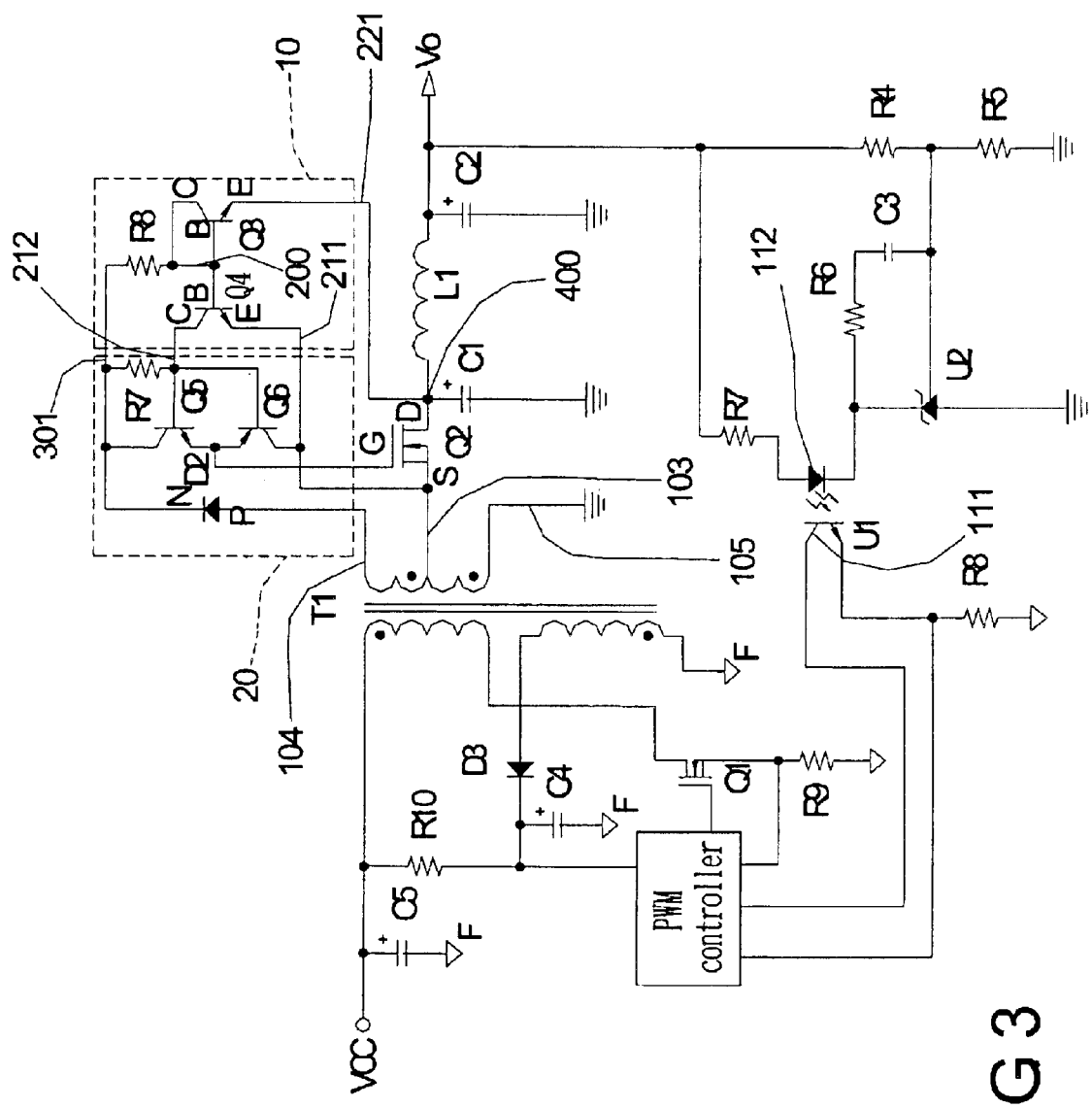
FIG. 3 is a circuit diagram of the present invention.

Please refer to FIG. 3, which is a circuit diagram of the present invention. The current detecting circuit 10 of the present invention is connected with an output circuit of a DC power supply for detecting the current outputted from the first output terminal 103 of the transformer T1. While the current decreases and approaches to zero, the current detecting circuit 10 will turn off the FET Q2 timely to prevent the current from flowing backward to the transformer T1 as the FET Q1 is turned on again. While the FET Q1 is turned off, the current detecting circuit 10 will drive the FET Q2 to release the electrical energy stored in the transformer T1. The secondary side of the transformer T1 includes the first output terminal 103, the second output terminal 104 and a reference terminal 105. The reference terminal 105 can be an electrical connection terminal.

The current detecting circuit 10 includes bipolar junction transistors and a first resistor R8. The bipolar junction transistors include a first transistor Q4 and second transistor Q3. Therein, the bases of the first transistor Q4 and second transistor Q3 are connected with the collector of the second transistor Q3 to form a common base terminal 200. The emitter and collector of the first transistor Q4 form a first detecting terminal 211 and a feedback terminal 212. The emitter of the second transistor Q3 forms a second detecting terminal 221. The first transistor Q4 and second transistor Q3 can be two equivalent NPN transistors.

The first resistor R8 has a first leg and second leg. The first leg is connected with the common base terminal 200 and the second leg is connected with an auxiliary power terminal 301. The FET Q2 has a source, a gate and a drain. The source is connected with the first output terminal 103 of the transformer T1. The drain is connected with a DC output terminal 400. The FET Q2 has low impedance. The minimum one can be 10 m$\Omega$.

The second output terminal 104 of the transformer T1 is connected with a buffer circuit 20. The buffer circuit 20 includes a diode D2, a third transistor Q5, a fourth transistor Q6 and a second resistor R7. Therein, the diode D2 has a positive electrode and a negative electrode. The positive electrode is connected with the second output terminal 104 of the transformer T1 and the negative electrode is connected with the auxiliary power terminal 301. The third transistor Q5 is a NPN transistor and has an emitter, a base and a collector. The collector is connected with the auxiliary power terminal 301.

Therein, the fourth transistor Q6 is a PNP transistor and has an emitter, a base and a collector. The emitter is connected with the emitter of the third transistor Q5 and the gate of the FET Q2. The base is connected with the base of the third transistor Q5 and the feedback terminal 212. The collector is connected with the first detecting terminal 211. The two ends of the second resistor R7 are connected with the feedback terminal 212 and the auxiliary power terminal 301, respectively.

Therein, the first detecting terminal 211 is connected with the source of the FET Q2 and the second detecting terminal 221 is connected with the drain of the FET Q2, i.e. the DC output terminal 400. The feedback terminal 212 is connected with the gate of the FET Q2. After the FET Q2 is turned on to release the stored energy in the transformer T1, by using the bipolar junction transistors to detect a tiny current of the first output terminal 103 of the transformer T1, the FET Q 2 will be turned off timely.

Figure 1:
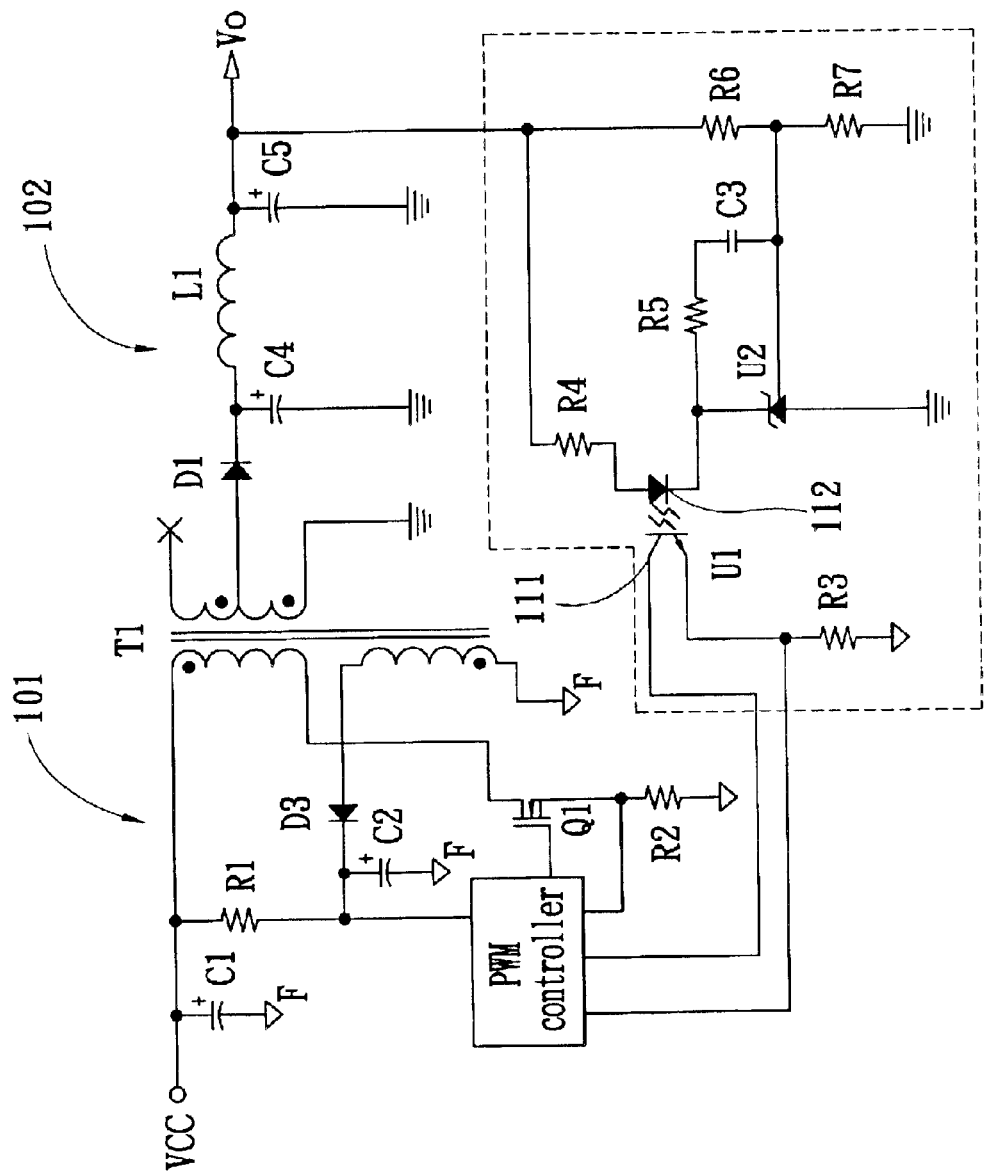
FIG. 1 is a schematic diagram of a conventional AC/DC flyback switching power supply.
Figure 2:
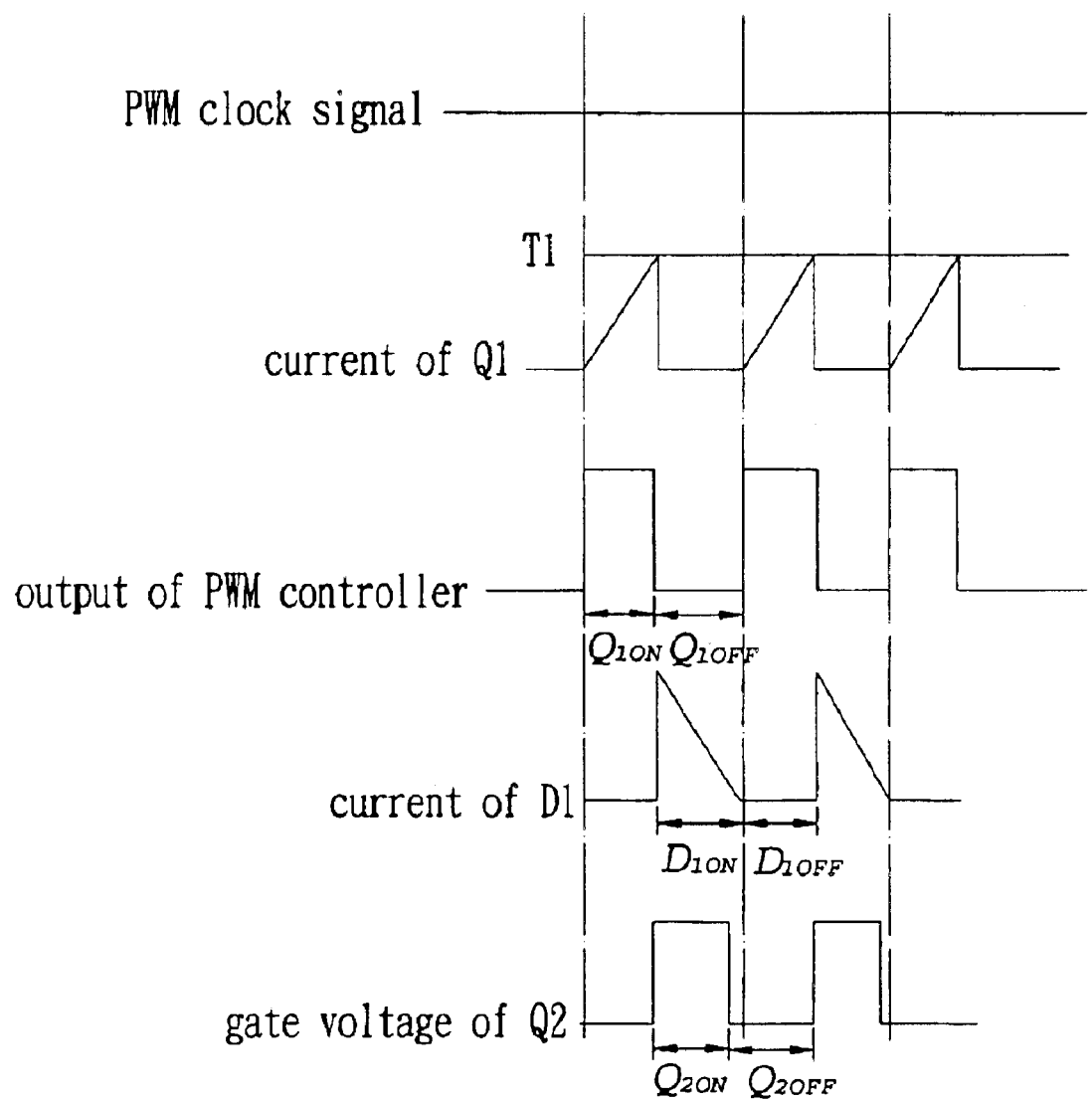
FIG. 2 shows output waveforms of several components.

The operation principle of the present invention is as following. When the DC output terminal 400 of the transformer T1 has a high potential, the second output terminal 104 of the transformer T1 provides an auxiliary power to the diode D2. Thus, the second resistor R7 is biased by the auxiliary power, the fourth transistor Q6 is turned off and the third transistor Q5 is turned on. Hence, the FET Q2 is driven to turn on and the current passing therethrough decreases in a manner with negative slope. Further, due to the passing current, the FET Q2 causes a slight voltage drop and the voltage drop also decreases in a manner with negative slope. As shown in FIG. 2, at this period, the first transistor Q4 is turned off and the second transistor Q3 is turned on. When the passing current is decreased to reach a specific value, the voltage drop across the FET Q2 is not large enough so that the second transistor Q3 is turned off and the first transistor Q4 is turned on. Then, the third transistor Q5 is turned off, the fourth transistor Q6 is turned on and the FET is turned off. Therefore, the FET can be turned on and off, cyclically.

Although the present invention has been described with reference to the preferred embodiment thereof, it will be understood that the invention is not limited to the details thereof. Various substitutions and modifications have been suggested in the foregoing description, and other will occur to those of ordinary skill in the art. Therefore, all such substituations and modifications are embraced within the scope of the invention as defined in the appended claims.

What is claimed is:

1. A current detecting circuit for a AC/DC flyback switching power supply, the current detecting circuit being connected to a secondary side of a transformer of the AC/DC flyback switching power supply for detecting a current of a direct current (DC) output terminal, the secondary side of the transformer having a first output terminal, a second output terminal and a reference terminal, the current detecting circuit comprising:

bipolar junction transistors, comprising a first transistor and a second transistor, the first transistor having a base connecting with a base and an collector of the second transistor to form a common base terminal, the first transistor having an emitter forming a first detecting terminal and having an emitter forming a feedback terminal, the second transistor having a collector forming a second detecting terminal; and a field-effect transistor (FET) having a source, a gate and a drain, the source connecting to the first output terminal of the transformer, the drain connecting to the DC output terminal;

wherein the first detecting terminal is connected with the source of the FET, the second detecting terminal is connected with the drain of the FET, the feedback terminal is connected with the gate of the FET; via detecting the tiny current of the DC output terminal by using the bipolar junction transistors, the FET being turned on or off to release an energy stored in the transformer.

2. The current detecting circuit as claimed in the claim 1, wherein the reference terminal of the transformer is an electrical connection terminal.

3. The current detecting circuit as claimed in the claim 1, wherein the first transistor and the second transistor are equivalent NPN transistors.

4. The current detecting circuit as claimed in the claim 1, wherein the FET has a low impedance, a minimum value of the impedance is 10 m$\Omega$.

5. The current detecting circuit as claimed in the claim 1 further comprising:

a first resistor having a first leg and a second leg, the first leg connecting with the common base terminal, the second leg forming an auxiliary power terminal.

6. The current detecting circuit as claimed in the claim 5, wherein the auxiliary power terminal connecting with the feedback terminal via a second resistor.

7. The current detecting circuit as claimed in the claim 1 further comprising a buffer circuit to assist the bipolar junction transistors in turning on the FET, the buffer circuit comprising:

a diode having a positive electrode and a negative electrode, the positive electrode connecting with the second output terminal of the transformer, the negative electrode connecting with an auxiliary power terminal;

a third transistor, which is a PNP transistor, the third transistor having a collector, a base and an emitter, the collector connecting with the auxiliary power terminal;

a fourth transistor, which is a NPN transistor, the fourth transistor having a collector, a base and an emitter, the emitter connecting with the emitter of the third transistor and the gate of the FET, the base connecting with the base of the third transistor and the feedback terminal, the collector connecting with the first detecting terminal; and a second resistor connecting the feedback terminal with the auxiliary power terminal.

8. The current detecting circuit as claimed in the claim 7, wherein the buffer circuit has an operation principle as following:

when the DC output terminal has a high potential, the second output terminal of the transformer providing an auxiliary power to the diode, the second resistor being biased by the auxiliary power to turn off the fourth transistor and turn on the third transistor Q5 so as to turn on the FET and decrease the current in a manner with negative slope, a slight voltage drop caused by the FET due to the current to turned off the first transistor and turned on the second transistor; when the current is decreased to reach a predetermined value, the voltage drop being insufficient so that the second transistor is turned off, the first transistor is turned on, the third transistor is turned off, the fourth transistor is turned on and the FET is turned off, thereby, the FET being turned on and off, cyclically.

* * * * *